(12) United States Patent
Haba (10) Patent No.: US 7,952,195 B2
(45) Date of Patent: May 31, 2011

(54) STACKED PACKAGES WITH BRIDGING TRACES

(75) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 604 days.

(21) Appl. No.: 11/648,172

(22) Filed: Dec. 28, 2006

(65) Prior Publication Data
US 2008/0157323 A1 Jul. 3, 2008

(51) Int. Cl.
*H01L 23/34* (2006.01)
*H01L 21/00* (2006.01)

(52) U.S. Cl. ........ 257/724; 257/774; 257/777; 257/783; 257/E25.01; 257/E25.013; 257/E23.01; 257/E23.011; 438/110

(58) Field of Classification Search .......................... None
See application file for complete search history.

(56) References Cited

U.S. PATENT DOCUMENTS

| | | |
|---|---|---|
| 4,074,342 A | 2/1978 | Honn et al. |
| 4,500,905 A | 2/1985 | Shibata |
| 4,765,864 A | 8/1988 | Holland et al. |
| 4,842,699 A | 6/1989 | Hua et al. |
| 4,897,708 A | 1/1990 | Clements |
| 4,954,875 A | 9/1990 | Clements |
| 5,322,816 A | 6/1994 | Pinter |
| 5,343,071 A | 8/1994 | Kazior et al. |
| 5,412,539 A | 5/1995 | Elwell et al. |
| 5,424,245 A | 6/1995 | Gurtler et al. |
| 5,426,072 A | 6/1995 | Finnila |
| 5,466,634 A | 11/1995 | Beilstein, Jr. et al. |
| 5,563,084 A | 10/1996 | Ramm et al. |
| 5,571,754 A | 11/1996 | Bertin et al. |
| 5,604,673 A | 2/1997 | Washburn et al. |
| 5,608,264 A | 3/1997 | Gaul |
| 5,614,766 A * | 3/1997 | Takasu et al. ................. 257/777 |
| 5,618,752 A | 4/1997 | Gaul |
| 5,646,067 A | 7/1997 | Gaul |
| 5,661,087 A | 8/1997 | Pedersen et al. |
| 5,682,062 A | 10/1997 | Gaul |
| 5,716,759 A | 2/1998 | Badehi |
| 5,766,984 A | 6/1998 | Ramm et al. |
| 5,767,001 A | 6/1998 | Bertagnolli et al. |
| 5,804,004 A | 9/1998 | Tuckerman et al. |

(Continued)

FOREIGN PATENT DOCUMENTS

DE 102004039906 A1 8/2005

(Continued)

OTHER PUBLICATIONS

International Search Report, PCT/US07/26095

(Continued)

*Primary Examiner* — Alonzo Chambliss
(74) *Attorney, Agent, or Firm* — Lerner, David, Littenberg, Krumholz & Mentlik, LLP (57) ABSTRACT

A microelectronic assembly that includes a first microelectronic element having a first rear surface. The assembly further includes a second microelectronic element having a second rear surface. The second microelectronic element is attached to the first microelectronic element so as to form a stacked package. A bridging element electrically connects the first microelectronic element and the second microelectronic element. The first rear surface of the first microelectronic element faces toward the second rear surface of the second microelectronic element.

8 Claims, 4 Drawing Sheets

U.S. PATENT DOCUMENTS

| | | | |
|---|---|---|---|
| 5,814,889 | A | 9/1998 | Gaul |
| 5,817,530 | A | 10/1998 | Ball |
| 5,880,010 | A | 3/1999 | Davidson |
| 5,915,167 | A | 6/1999 | Leedy |
| 5,946,545 | A | 8/1999 | Bertin et al. |
| 5,973,386 | A | 10/1999 | Horikawa |
| 6,022,758 | A | 2/2000 | Badehi |
| 6,031,274 | A | 2/2000 | Muramatsu et al. |
| 6,040,235 | A | 3/2000 | Badehi |
| 6,103,552 | A | 8/2000 | Lin |
| 6,130,823 | A | 10/2000 | Lauder et al. |
| 6,133,640 | A | 10/2000 | Leedy |
| 6,177,707 | B1 | 1/2001 | Dekker et al. |
| 6,177,721 | B1* | 1/2001 | Suh et al. .................. 257/686 |
| 6,188,129 | B1 | 2/2001 | Paik et al. |
| 6,204,562 | B1 | 3/2001 | Ho et al. |
| 6,208,545 | B1 | 3/2001 | Leedy |
| 6,261,865 | B1 | 7/2001 | Akram |
| 6,277,669 | B1 | 8/2001 | Kung et al. |
| 6,340,845 | B1* | 1/2002 | Oda ............................ 257/777 |
| 6,344,401 | B1 | 2/2002 | Lam |
| 6,396,710 | B1 | 5/2002 | Iwami et al. |
| 6,472,247 | B1 | 10/2002 | Andoh et al. |
| 6,472,293 | B1 | 10/2002 | Suga |
| 6,492,201 | B1 | 12/2002 | Haba |
| 6,498,381 | B2 | 12/2002 | Halahan et al. |
| 6,498,387 | B1 | 12/2002 | Yang |
| 6,548,391 | B1 | 4/2003 | Ramm et al. |
| 6,551,857 | B2 | 4/2003 | Leedy |
| 6,563,224 | B2 | 5/2003 | Leedy |
| 6,582,991 | B1 | 6/2003 | Maeda et al. |
| 6,607,938 | B2 | 8/2003 | Kwon et al. |
| 6,608,377 | B2 | 8/2003 | Chang et al. |
| 6,611,052 | B2 | 8/2003 | Poo et al. |
| 6,632,706 | B1 | 10/2003 | Leedy |
| 6,646,289 | B1 | 11/2003 | Badehi et al. |
| 6,656,827 | B1 | 12/2003 | Tsao et al. |
| 6,693,358 | B2 | 2/2004 | Yamada et al. |
| 6,717,254 | B2 | 4/2004 | Siniaguine |
| 6,727,576 | B2 | 4/2004 | Hedler et al. |
| 6,737,300 | B2 | 5/2004 | Ding et al. |
| 6,743,660 | B2 | 6/2004 | Lee et al. |
| 6,753,205 | B2 | 6/2004 | Halahan |
| 6,777,767 | B2 | 8/2004 | Badehi et al. |
| 6,806,559 | B2 | 10/2004 | Gann et al. |
| 6,828,175 | B2 | 12/2004 | Wood et al. |
| 6,844,241 | B2 | 1/2005 | Halahan et al. |
| 6,844,619 | B2 | 1/2005 | Tago |
| 6,864,172 | B2 | 3/2005 | Noma et al. |
| 6,867,123 | B2 | 3/2005 | Katagiri et al. |
| 6,870,249 | B2* | 3/2005 | Egawa ........................ 257/686 |
| 6,878,608 | B2 | 4/2005 | Brofman et al. |
| 6,897,148 | B2 | 5/2005 | Halahan et al. |
| 6,958,285 | B2 | 10/2005 | Siniaguine |
| 6,972,480 | B2 | 12/2005 | Zilber et al. |
| 6,972,483 | B1 | 12/2005 | Song |
| 6,982,475 | B1 | 1/2006 | MacIntyre |
| 6,984,545 | B2 | 1/2006 | Grigg et al. |
| 6,984,885 | B1* | 1/2006 | Harada et al. .................. 257/696 |
| 7,001,825 | B2 | 2/2006 | Halahan et al. |
| 7,034,401 | B2 | 4/2006 | Savastiouk et al. |
| 7,049,170 | B2 | 5/2006 | Savastiouk et al. |
| 7,060,601 | B2 | 6/2006 | Savastiouk et al. |
| 7,087,459 | B2 | 8/2006 | Koh |
| 7,138,295 | B2 | 11/2006 | Leedy |
| 7,160,753 | B2 | 1/2007 | Williams, Jr. |
| 7,186,586 | B2 | 3/2007 | Savastiouk et al. |
| 7,192,796 | B2 | 3/2007 | Zilber et al. |
| 7,193,239 | B2 | 3/2007 | Leedy |
| 7,215,018 | B2 | 5/2007 | Vindasius et al. |
| 7,241,641 | B2 | 7/2007 | Savastiouk et al. |
| 7,241,675 | B2 | 7/2007 | Savastiouk et al. |
| 7,285,865 | B2 | 10/2007 | Kwon et al. |
| 7,474,004 | B2 | 1/2009 | Leedy |
| 7,495,316 | B2 | 2/2009 | Kirby et al. |
| 7,504,732 | B2 | 3/2009 | Leedy |
| 7,510,928 | B2 | 3/2009 | Savastiouk et al. |
| 7,521,360 | B2 | 4/2009 | Halahan et al. |
| 7,662,710 | B2 | 2/2010 | Shiv |
| 7,705,466 | B2 | 4/2010 | Leedy |
| 2002/0047199 | A1 | 4/2002 | Ohuchi et al. |
| 2002/0074637 | A1* | 6/2002 | McFarland .................. 257/686 |
| 2002/0109236 | A1 | 8/2002 | Kim et al. |
| 2002/0127775 | A1 | 9/2002 | Haba et al. |
| 2002/0132465 | A1 | 9/2002 | Leedy |
| 2002/0171145 | A1 | 11/2002 | Higuchi et al. |
| 2003/0094683 | A1 | 5/2003 | Poo et al. |
| 2003/0173608 | A1 | 9/2003 | Leedy |
| 2003/0209772 | A1 | 11/2003 | Prabhu |
| 2003/0233704 | A1 | 12/2003 | Castellote |
| 2004/0016942 | A1 | 1/2004 | Miyazawa et al. |
| 2004/0070063 | A1 | 4/2004 | Leedy |
| 2004/0082114 | A1 | 4/2004 | Horng |
| 2004/0104454 | A1 | 6/2004 | Takaoka et al. |
| 2004/0142509 | A1 | 7/2004 | Imai |
| 2004/0155326 | A1 | 8/2004 | Kanbayashi |
| 2004/0155354 | A1 | 8/2004 | Hanaoka et al. |
| 2004/0169278 | A1 | 9/2004 | Kinsman |
| 2004/0221451 | A1 | 11/2004 | Chia et al. |
| 2004/0222508 | A1 | 11/2004 | Aoyagi |
| 2004/0251525 | A1 | 12/2004 | Zilber et al. |
| 2005/0012225 | A1 | 1/2005 | Choi et al. |
| 2005/0046002 | A1 | 3/2005 | Lee et al. |
| 2005/0056903 | A1 | 3/2005 | Yamamoto et al. |
| 2005/0067680 | A1 | 3/2005 | Boon et al. |
| 2005/0073035 | A1 | 4/2005 | Moxham |
| 2005/0095835 | A1 | 5/2005 | Humpston et al. |
| 2005/0156330 | A1 | 7/2005 | Harris |
| 2005/0260794 | A1 | 11/2005 | Lo et al. |
| 2005/0263866 | A1 | 12/2005 | Wan |
| 2005/0287783 | A1 | 12/2005 | Kirby et al. |
| 2006/0006488 | A1 | 1/2006 | Kanbe |
| 2006/0017161 | A1 | 1/2006 | Chung et al. |
| 2006/0043556 | A1 | 3/2006 | Su et al. |
| 2006/0043598 | A1 | 3/2006 | Kirby et al. |
| 2006/0043601 | A1 | 3/2006 | Pahl |
| 2006/0046348 | A1 | 3/2006 | Kang |
| 2006/0046471 | A1 | 3/2006 | Kirby et al. |
| 2006/0055061 | A1 | 3/2006 | Hosokawa et al. |
| 2006/0068580 | A1 | 3/2006 | Dotta |
| 2006/0076670 | A1 | 4/2006 | Lim et al. |
| 2006/0079019 | A1 | 4/2006 | Kim |
| 2006/0094165 | A1 | 5/2006 | Hedler et al. |
| 2006/0115932 | A1 | 6/2006 | Farnworth et al. |
| 2006/0138626 | A1 | 6/2006 | Liew et al. |
| 2006/0175697 | A1 | 8/2006 | Kurosawa et al. |
| 2006/0220234 | A1 | 10/2006 | Honer et al. |
| 2006/0220262 | A1 | 10/2006 | Meyer et al. |
| 2006/0292866 | A1 | 12/2006 | Borwick et al. |
| 2007/0007556 | A1 | 1/2007 | Shibayama |
| 2007/0035001 | A1 | 2/2007 | Kuhmann et al. |
| 2007/0045803 | A1 | 3/2007 | Ye et al. |
| 2007/0045862 | A1* | 3/2007 | Corisis et al. .................. 257/777 |
| 2007/0052050 | A1 | 3/2007 | Dierickx |
| 2007/0102802 | A1 | 5/2007 | Kang et al. |
| 2007/0126085 | A1 | 6/2007 | Kawano et al. |
| 2007/0132082 | A1 | 6/2007 | Tang et al. |
| 2007/0148941 | A1 | 6/2007 | Haba et al. |
| 2007/0158807 | A1 | 7/2007 | Lu et al. |
| 2007/0181989 | A1 | 8/2007 | Corisis et al. |
| 2007/0190747 | A1 | 8/2007 | Humpston et al. |
| 2007/0249095 | A1 | 10/2007 | Song et al. |
| 2008/0083976 | A1 | 4/2008 | Haba et al. |
| 2008/0083977 | A1 | 4/2008 | Haba et al. |
| 2008/0090333 | A1 | 4/2008 | Haba et al. |
| 2008/0099900 | A1 | 5/2008 | Oganesian et al. |
| 2008/0116544 | A1 | 5/2008 | Grinman et al. |
| 2008/0116545 | A1 | 5/2008 | Grinman et al. |
| 2008/0246136 | A1 | 10/2008 | Haba et al. |
| 2008/0284041 | A1 | 11/2008 | Jang et al. |
| 2008/0315407 | A1 | 12/2008 | Andrews, Jr. et al. |
| 2009/0032966 | A1 | 2/2009 | Lee et al. |
| 2009/0039528 | A1 | 2/2009 | Haba et al. |
| 2009/0065907 | A1 | 3/2009 | Haba et al. |
| 2009/0067210 | A1 | 3/2009 | Leedy |
| 2009/0160065 | A1 | 6/2009 | Haba et al. |
| 2009/0174082 | A1 | 7/2009 | Leedy |

| | | | |
|---|---|---|---|
| 2009/0175104 A1 | 7/2009 | Leedy | |
| 2009/0212381 A1 | 8/2009 | Crisp et al. | |
| 2009/0218700 A1 | 9/2009 | Leedy | |
| 2009/0219742 A1 | 9/2009 | Leedy | |
| 2009/0219743 A1 | 9/2009 | Leedy | |
| 2009/0219744 A1 | 9/2009 | Leedy | |
| 2009/0219772 A1 | 9/2009 | Leedy | |
| 2009/0230501 A1 | 9/2009 | Leedy | |
| 2009/0309235 A1 | 12/2009 | Suthiwongsunthorn et al. | |
| 2009/0316378 A1 | 12/2009 | Haba et al. | |
| 2010/0053407 A1 | 3/2010 | Crisp et al. | |

FOREIGN PATENT DOCUMENTS

| | | | |
|---|---|---|---|
| EP | 0926723 | A1 | 6/1999 |
| EP | 1041624 | A1 | 10/2000 |
| EP | 1482553 | A2 | 12/2004 |
| EP | 1519410 | A1 | 3/2005 |
| EP | 1619722 | A1 | 1/2006 |
| EP | 1653510 | A2 | 5/2006 |
| EP | 1686627 | A1 | 8/2006 |
| EP | 1 741 668 | A2 | 1/2007 |
| EP | 1801866 | A2 | 6/2007 |
| FR | 2704690 | A1 | 11/1994 |
| JP | 60160645 | A | 8/1985 |
| JP | 2001-217386 | A | 8/2001 |
| JP | 2003-037758 | A | 2/2003 |
| KR | 2006-0020822 | A | 3/2006 |
| WO | 9845130 | A1 | 10/1998 |
| WO | 9940624 | | 8/1999 |
| WO | 2004/025727 | A1 | 3/2004 |
| WO | 2004114397 | | 12/2004 |
| WO | 2005081315 | A2 | 9/2005 |
| WO | 2009017758 | A2 | 2/2009 |
| WO | 2009017835 | A2 | 2/2009 |
| WO | 2009023462 | A1 | 2/2009 |

OTHER PUBLICATIONS

U.S. Appl. No. 11/590,616, filed Oct. 31, 2006.
U.S. Appl. No. 11/789,694, filed Apr. 25, 2007.
U.S. Appl. No. 12/143,743, "Recontituted Wafer Level Stacking", filed Jun. 20, 2008.
Bang, U.S. Appl. No. 60/030,463, filed Sep. 6, 2002.
Communication from PCT/US2010/000777, dated Aug. 5, 2010.
International Search Report, PCT/US08/09207, dated Jan. 16, 2009.
International Search Report, PCT/US2007/021552.
International Search Report, PCT/US2008/002659.
International Search Report, PCT/US2008/009353.
International Search Report, PCT/US2008/009356.
International Search Report, PCT/US2008/010746, date May 27, 2009.
International Search Report, PCT/US2009/003643, dated Aug. 28, 2009.
Office Action from Chinese Application No. 2007800504745 dated Jul. 8, 2010.
Partial International Search Report, PCT/US2008/002659.
PCT/US08/09207, "Reconstituted Wafer Stack Packaging With After Applied Pad Extensions," filed Jul. 25, 2008.
U.S. Appl. No. 11/582,186.
U.S. Appl. No. 11/704,713.
U.S. Appl. No. 12/456,349.
U.S. Appl. No. 12/670,952.
U.S. Appl. No. 12/671,993.
U.S. Appl. No. 12/723,039.
U.S. Appl. No. 12/784,841.
U.S. Appl. No. 60/850,850.
U.S. Appl. No. 60/936,617.
U.S. Appl. No. 60/962,200.
U.S. Appl. No. 60/963,209.
U.S. Appl. No. 60/964,069.

* cited by examiner

STACKED PACKAGES WITH BRIDGING TRACES

BACKGROUND OF THE INVENTION

The present invention generally relates to stacked microelectronic packages and more particularly relates to stacked microelectronic packages fabricated at the wafer level and to methods of making such packages.

Semiconductor chips are flat bodies with contacts disposed on the front surface that are connected to the internal electrical circuitry of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone.

The substrate materials used for packaging semiconductor chips are selected for their compatibility with the processes used to form the packages. For example, during solder or other bonding operations, intense heat may be applied to the substrate. Accordingly, metal lead frames have been used as substrates. Laminate substrates have also been used to package microelectronic devices. Such substrates may include two to four alternating layers of fiberglass and epoxy, wherein successive fiberglass layers may be laid in traversing, e.g., orthogonal, directions. Optionally, heat resistive compounds such as bismaleimide triazine (BT) may be added to such laminate substrates.

Tapes have been used as substrates to provide thinner microelectronic packages. Such tapes are typically provided in the form of sheets or rolls of sheets. For example, single and double sided sheets of copper-on-polyimide are commonly used. Polyimide based films offer good thermal and chemical stability and a low dielectric constant, while copper having high tensile strength, ductility, and flexure has been advantageously used in both flexible circuit and chip scale packaging applications. However, such tapes are relatively expensive, particularly as compared to lead frames and laminate substrates.

Microelectronic packages also include wafer level packages, which provide a package for a semiconductor component that is fabricated while the die are still in a wafer form. The wafer is subject to a number of additional process steps to form the package structure and the wafer is then diced to free the individual die, with no additional fabrication steps being necessary. Wafer level processing provides an advantage in that the cost of the packaging processes are divided among the various die on the wafer, resulting in a very low price differential between the die and the component. Furthermore, the package footprint can be substantially similar to the die size, resulting in very efficient utilization of area on a printed circuit board (PCB) to which the die will eventually be attached. As a result of these features, die packaged in this manner are commonly referred to as wafer level chip scale package (WLCSP).

In order to save space certain conventional designs have stacked multiple microelectronic chips within a package. This allows the package to occupy a surface area on a substrate that is less than the total surface area of the chips in the stack.

In spite of the above advances, there remains a need for improved wafer-scale packages and especially stacked wafer-scale packages that are reliable and that are economical to manufacture.

SUMMARY OF THE INVENTION

The present invention is directed to a microelectronic assembly that includes a first microelectronic element having a first rear surface. The assembly further includes a second microelectronic element having a second rear surface. The second microelectronic element is attached to the first microelectronic element so as to form a stacked package. The first rear surface of the first microelectronic element faces toward the second rear surface of the second microelectronic element.

Moreover, the assembly includes at least one bridging element. The first microelectronic element and second microelectronic element each have a front surface and a plurality of contacts exposed there at. The at least one bridging element extends between the plurality of contacts of the first microelectronic element and the plurality of contacts of the second microelectronic element so as to electrically connect the two.

In one aspect the first microelectronic element includes a first edge and a second edge extending from the front surface to the rear surface of the first microelectronic element. And the at least one bridging element is disposed outside of the first edge and second edge. A plurality of traces exposed on the respective front surfaces of the first microelectronic element and second microelectronic element may be included as well. At least some of the plurality of traces extend from at least some of the plurality of contacts on the first microelectronic element to the at least one bridging element and at least some of the plurality of traces extend from at least some of the plurality of contacts of the second microelectronic element to the at least one bridging element.

The microelectronic assembly in certain embodiments includes an adhesive that attaches the first microelectronic element to the second microelectronic element. And in another aspect, the first microelectronic element includes a first edge and a second edge. The at least one bridging element is positioned between the first edge and the second edge. Also the second microelectronic element may have a first edge and a second edge such that the at least one bridging element is positioned between the first edge and the second edge of the second microelectronic element.

In another aspect, the first microelectronic element includes a plurality of vias extending from the front face to the rear face and the at least one bridging element is disposed within at least one of the plurality of vias.

The assembly may further include a third microelectronic element having a front face and a rear face and a fourth microelectronic element having a rear face. The third and fourth microelectronic elements are attached such that the rear face of the third microelectronic element faces toward the rear face of the fourth microelectronic element. The third microelectronic element is also attached to the first second microelectronic element such that the front face of the third microelectronic element faces toward the front surface of the second microelectronic element.

The present invention is also directed to a method of assembling a stacked microelectronic assembly comprising the steps of forming a microelectronic assembly by stacking a first subassembly including a plurality of microelectronic elements onto a second subassembly including a plurality of microelectronic elements. The rear faces of the first subassembly and second subassembly confront one another. Next, a plurality of contacts exposed at a front face of the first subassembly is connected to a plurality of contacts exposed at a front face of the second subassembly.

The first subassembly and second subassembly each may include saw lanes that are aligned during the step of forming the microelectronic assembly. And the method may include dicing through the saw lanes of the first and second subassemblies so as so form individual stacked units. At least some of the plurality of microelectronic elements of the first subassembly and the second subassembly have traces that extend from respective contacts to the saw lanes of the respective first and second subassemblies such that after the dicing step the traces are exposed.

DETAILED DESCRIPTION

Figure 1A:
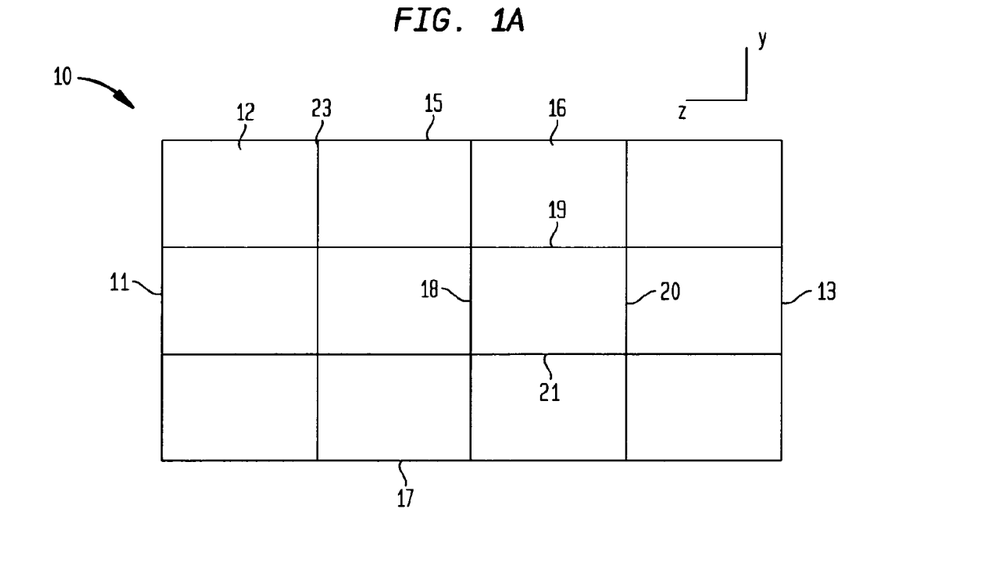
FIG. 1A is a top view of a subassembly according to one embodiment of the present invention.
Figure 1B:
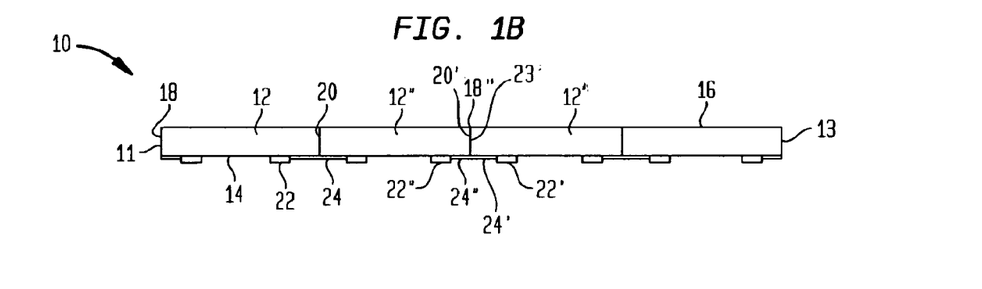
FIG. 1B is a cross-sectional view of the subassembly of FIG. 1A.

Reference is now made to FIGS. 1A and 1B, which illustrate a top view and a cross-sectional view, respectively of a wafer or first subassembly 10. As shown in the figures, a portion of a first wafer or subassembly 10 includes a plurality of microelectronic elements 12, each positioned side by side and adjacent to one another. The first subassembly preferably includes numerous rows of microelectronic elements 12 aligned along an X-axis and a Y-axis in various columns and rows. The microelectronic elements 12 are formed integral with one another using conventional semiconductor process techniques. The present invention is also applicable to reconstituted wafers.

Each microelectronic element 12 includes a front face 14 and an oppositely-facing rear face 16. The microelectronic elements 12 also include first edges 18, second edges 20, third edges 19 and fourth edges 21, all of which extend from the front faces 14 to the rear faces 16 of the microelectronic elements 12. As shown in FIGS. 1A and 1B, a first edge 18 of one microelectronic element 12 is attached to a second edge 20 of a second and adjacent microelectronic element 12. Thus, the microelectronic elements 12 positioned within the middle of the first subassembly 10 are bordered by an adjacent microelectronic element 12 at all four edges, as shown in FIG. 1A. The microelectronic elements 12 positioned at a first end 11, a second end 13, a third end 15 or a fourth end 17 of the wafer have at least one edge unencumbered by an additional microelectronic element.

Although the edges are depicted in the drawings for clarity of illustration, in practice the edges may not be visible. Rather, at this stage the edges or strips where adjacent microelectronic elements 12 contact one another are saw lanes or strips where the wafer can be cut without damaging the individual microelectronic elements. For instance, as shown in FIG. 1B, second edge 20' of microelectronic element 12' abuts first edge 18" of microelectronic element 12" and forms a saw lane 23. Similarly, throughout the wafer 10, saw lanes 23 are located at positions where microelectronic elements 12 abut one another. The first wafer/subassembly 10 may include any number of microelectronic elements including as little as one or as many as is desirable.

Each of the microelectronic elements 12 in subassembly 10 also include a plurality of contacts 22 exposed at their respective front faces 16. Further, the contacts 22 are attached to traces 24 that extend from the contacts 22 to an edge of the microelectronic element. For instance, microelectronic 12' includes contact 22' and trace 24', which extends from contact 22' to first edge 18' of the microelectronic element 12'. Similarly, microelectronic element 12" includes contact 22" and trace 24", which extends from contact 22" to second edge 20" of microelectronic element 12". In one embodiment, traces 24' and 24" actually are a unitary structure extending between contacts 22' and 22" of adjacent microelectronic elements 12', 12". Thus, traces 24' and 24" meet at the attachment point of microelectronic elements 12' and 12", or at saw lane 23'. However, it is not required that the traces actually contact one another but rather that these traces 24 simply extend toward a respective end of the microelectronic elements 12 and into the width of the saw lanes.

Figure 2:
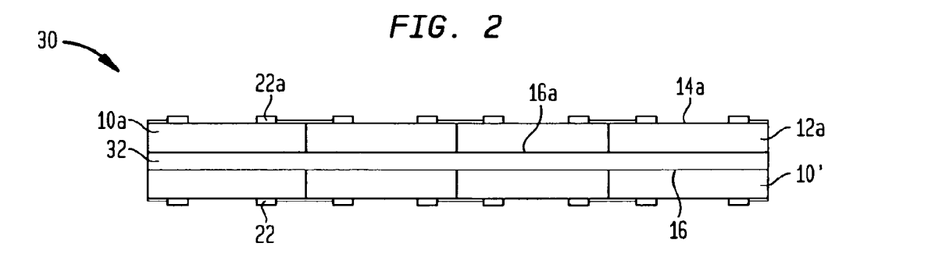
FIG. 2 is a cross-sectional view of a plurality of subassemblies attached to one another to form a stacked assembly.

As shown in FIG. 2, to create a stacked assembly 30, the first subassembly 10 is positioned under a second wafer/subassembly 10A. The second subassembly 10A is similarly constructed to the first subassembly 10, and thus like elements will be given similar character references unless otherwise specified.

As shown in FIG. 2, the second assembly 10A is inverted such that contacts 22A exposed at front faces 14A of microelectronic elements 12A face in an opposite direction as opposed to contacts 22 of subassembly 10. Thus, as shown in FIG. 2, the rear faces 16A of subassembly 10A face towards the rear faces 16 of subassembly 10. When positioning the respective subassemblies 10, 10A, the microelectronic elements 12 are aligned with the microelectronic elements 12A. The respective first, second, third, and fourth edges of each of the microelectronic elements 12, 12A are aligned along respective longitudinal axes. And the respective saw lanes 23, 23A of each of the subassemblies 10, 10A are also aligned. The stacked assembly 30 consists of a plurality of microelectronic elements 12, 12A, oriented and aligned in various rows and columns.

To attach the two subassemblies 10, 10a, an adhesive layer 32 is positioned between the rear faces 16, 16A and adhered thereto. The adhesive layer 32 is preferably comprised of an adhesive, epoxy or the like, and once cured, maintains a connection between the two subassemblies 10, 10A, such that the subassemblies are attached to one another and form stacked assembly 30. The two subassemblies 10, 10A may be attached using other methods that do not involve the use of an adhesive such as directly attaching the rear faces 16 of the subassembly 10 to the rear faces 16A of the second subassembly 10A. For example, solder bonding, eutectic bonding, diffusion bonding or other known bonding procedures can be used.

Figure 3:
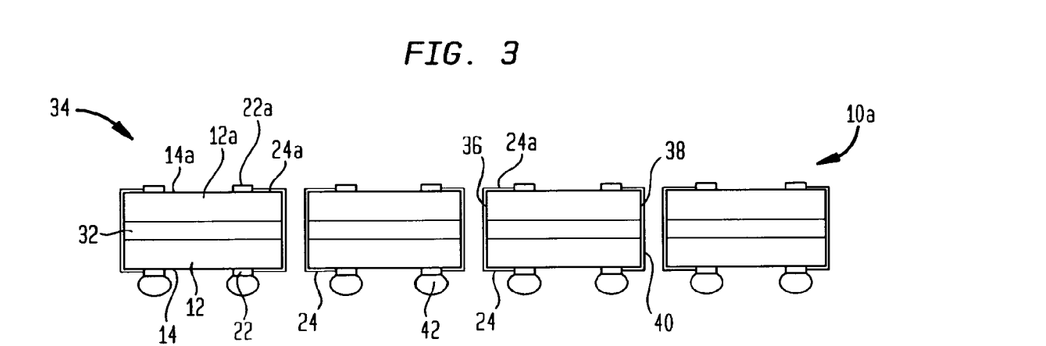
FIG. 3 is a cross-sectional view of the stacked assembly of FIG. 2 after the stacked assembly has been diced into individual units.

Next, the stacked assembly 30 is diced to form individual stacked units 34 using a mechanical cutting instrument not shown in the figures. Examples of such a mechanical cutting instrument can be found in U.S. Pat. Nos. 6,646,289 and 6,972,480, the disclosures of which are hereby incorporated by reference herein. The stacked assembly 30 is diced at locations that correspond to saw lanes 23, 23A of the individual subassemblies 10, 10A and various edges of the microelectronic elements 12, 12A. Since the ends of the traces 24, 24A that are remote from the contacts 22, 22A are positioned within the saw lanes 23, 23A, the dicing of the stacked assembly 30 causes these ends to become exposed.

Each individual stacked unit 34 includes a microelectronic element 12A disposed above a microelectronic element 12 and attached thereto by adhesive layer 32. The respective front faces 14, 14A of the microelectronic elements 12, 12A face in opposite directions as do the contacts 22, 22A of respective microelectronic elements. In addition, the individual stacked units 34 include a first side wall 36 and a second side wall 38 that extend between the front faces 14, 14A of the microelectronic elements 12 and 12A. Adjacent to both side walls 36, 38 are the ends of the traces 24, 24A that are exposed after the dicing process.

Bridging elements such as trace bridges 40 are then formed on the side walls 36 and 38. A trace bridge 40 extends from a trace 40 across either side wall 36 or side wall 38 to a trace 24A, and thereby electrically interconnects the two traces disposed on opposite faces of individual stacked units 34. The traces bridges extend about the edges of the microelectronic elements as well as the edges of the adhesive layer 32 that is exposed as a result of the dicing process. As a result of the trace bridge 40, a contact 22 is in electrical communication with a contact 22A. Prior to the trace bridges 40 being formed, a dielectric layer 41 may be disposed onto the exposed edges of the microelectronic elements and adhesive layer so as to electrically isolate the trace bridges from the bodies of the microelectronic elements if desired.

With reference still to FIG. 3, a mass of conductive material 42 may be deposited onto contacts 22 so as to enable the individual stacked units 34 to be electrically connected to a substrate such as a circuit panel and the like. The mass of conductive material 42 may be a ball of solder or similar material.

Figure 4:
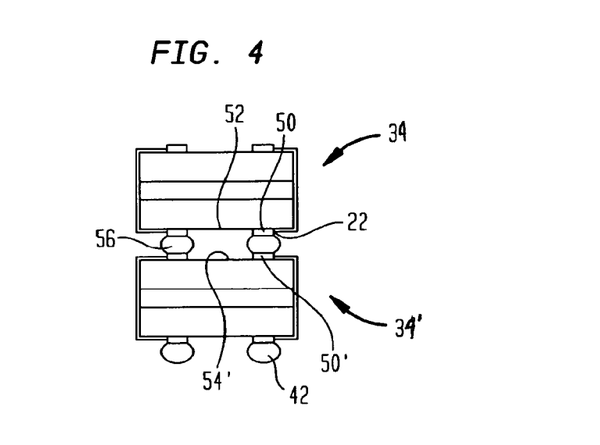
FIG. 4 is a cross-sectional view of individual units of FIG. 3 stacked upon each other.

According to one aspect of the present invention, individual stacked units 34 and 34' may be stacked one upon another with contacts of individual stacked unit 34 being electrically connected to contacts of individual stacked unit 34' as shown in FIG. 4. For example, to electrically connect the individual stacked units 34, 34', the contacts 50 exposed at a lower surface 52 of stacked unit 34 is aligned with the contacts 50' exposed at the top surface 54' of stacked unit 34' The contacts 50 and 50' may then be electrically connected using a mass of conductive material 56 such as solder or attached to one another using other methods known to those in the art.

Figure 5A:
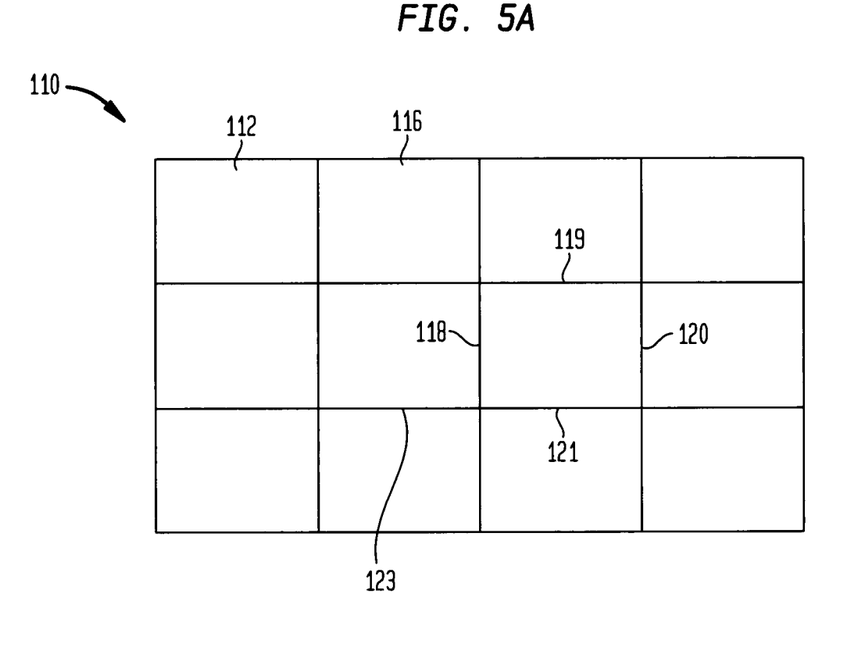
FIG. 5A is a top view of a subassembly according to one embodiment of the present invention.
Figure 5B:
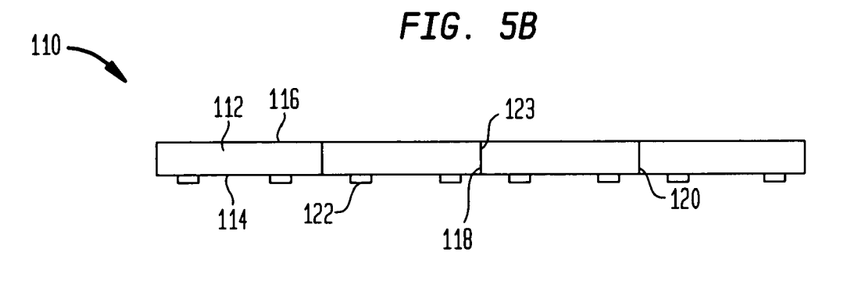
FIG. 5B is a cross-sectional view of the subassembly of FIG. 5A.

In one aspect of the present invention, a subassembly 110 including a plurality of microelectronic elements 112 may be provided as shown in FIGS. 5A and 5B. Subassembly 110 is similarly constructed as subassembly 10 and includes many of the same features. For this reason, like elements will be given similar character references unless otherwise specified. The microelectronic elements 112 of subassembly 110 include a front face 114 and an oppositely-facing rear face 116.

Additionally, each microelectronic element 112 includes a first edge 118, a second edge 120, a third edge 119 and a fourth edge 121 extending between the front face 114 and rear face 116. The locations were one edge of a first microelectronic element abuts an edge of a second microelectronic element forms saw lanes 123. As mentioned with regard to subassembly 10, the saw lanes may be cut there through without damaging the individual microelectronic elements 112 of the subassembly 110. And although demarcation lines are shown in FIGS. 5A to 5B for clarity of illustration, in practice a clear separation between adjacent microelectronic elements 112 may not be recognizable. Each microelectronic element 112 also includes a plurality of contacts 122 exposed at their respective front face 114. Although the subassembly 110 is illustrated having four rows and three columns of microelectronic elements, the number of microelectronic elements may be as little as one and as many as is desirable.

Figure 6:
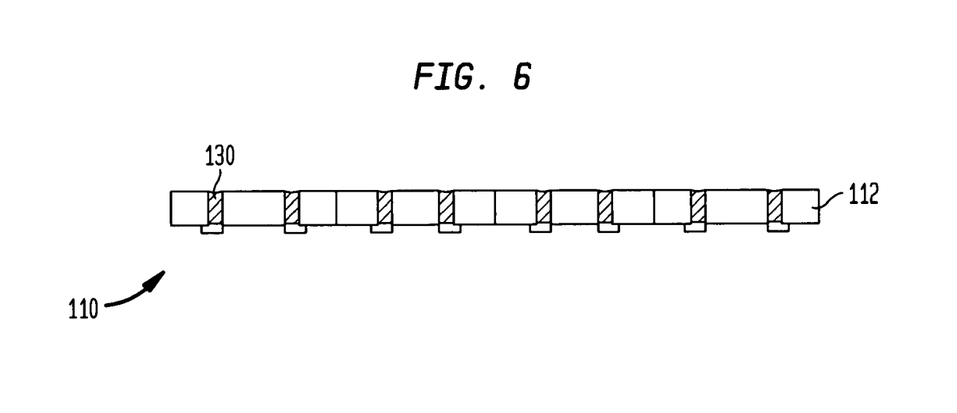
FIG. 6 is a cross-sectional view of the subassembly of FIG. 5B at a later stage of assembly.

Next, with reference to FIG. 6, the subassembly 110 is subjected to a mechanical cutting process that bores vias 130 through each of the microelectronic elements 112. The vias extend from a rear face 116 to a front face 114 of each of the microelectronic elements. And each of the vias 130 is preferably aligned with a contact 122 exposed on the front face 114 of each of the microelectronic elements 112 such that the contacts 122 are not only exposed at the front faces 114 but also at the rear faces 116.

After the vias 130 are formed, they are filled with a conductive material 131 such as a metal. The conductive material 131 may for instance be formed from copper or a copper/gold alloy.

Figure 7:
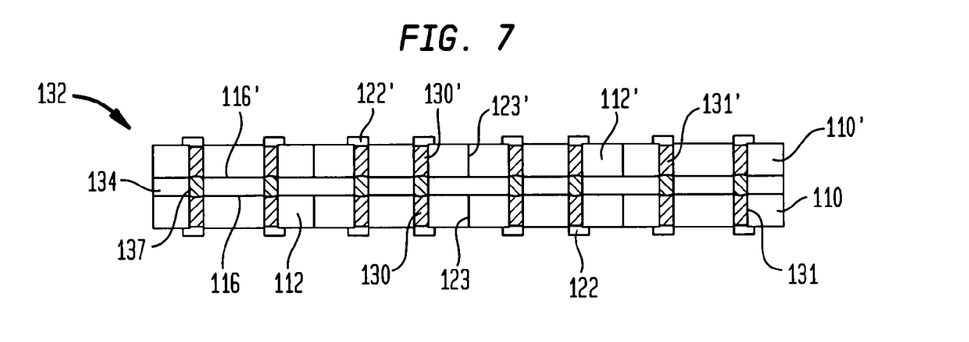
FIG. 7 is a cross-sectional view of a plurality of subassemblies of FIG. 6 attached to one another to form a stacked assembly.

As shown in FIG. 7, a stacked assembly 132 may be assembled by attaching the first subassembly 110 to a second subassembly 110'. The second subassembly 110' is similarly constructed as subassembly 110 and like features are described using similar character references unless otherwise specified. To form stacked assembly 132, the second subassembly 110' is inverted such that the rear faces 116' of the microelectronic elements 112' of the second subassembly face toward the rear faces 116 of microelectronic elements 112. When aligning the two subassemblies, the saw lanes 123 of subassembly 110 are aligned with the saw lanes 123' of second subassembly 110' and the vias 130, 130' of each of the subassemblies are also aligned. By aligning the vias 130 to the vias 130', the contacts 122 of the microelectronic elements 112 are aligned with the contacts 122' of the second subassembly and the conductive material 131, 131' of each of the vias 130, 130' are brought proximate to one another.

To attach the second subassembly 110' to the subassembly 110, a second conductive material 137 may be utilized. For example, masses of the second conductive material 137, such as solder, are disposed in and around the vias 130 proximate the rear faces 116 of the microelectronic elements 112 and in contact with the conductive material 131 contained within the vias. The subassembly 110 is then brought proximate with the second subassembly 110' such that the second conductive material 137 is proximate vias 130' and in contact with the conductive material 131' of the second subassembly. As shown in FIG. 7, this configuration causes the contacts 122 to be electrically connected to contacts 122' through the various conductive materials disposed within the vias 130, 130' and thus the conductive material 131, 131' act as electrical bridges between contacts 122, 122'. A back fill such as encapsulant material 134 or an adhesive may be positioned between the two subassemblies 110, 110' to provide additional rigidity to the stacked assembly 132.

In an alternate embodiment, although not shown in the figures, the conductive material 131 of subassembly 110 may be directly adhered to the conductive material 131' of the second subassembly 110'. For instance, if the conductive material 130, 130' is copper, the copper in each via 130, 130' is reflowed and allowed to contact the copper in an aligned via. Once solidified, the copper in adjacent vias 130, 130', forms, not only an attachment area between the subassemblies but also an electrical connection between contacts 122, 122'.

Figure 8:
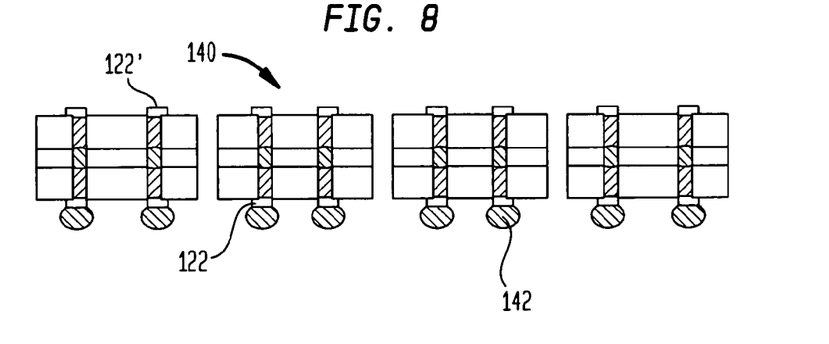
FIG. 8 is a cross-sectional view of the stacked assembly of FIG. 7 after the stacked assembly has been diced into individual units.

The stacked assembly 132 is now ready to be diced into individual stacked units 140. For this, a similar mechanical instrument (not shown in the figures) described previously is brought proximate the saw lanes 123, 123' of each of the subassemblies 110, 110'. The mechanical tool is passed through the stacked assembly 132 at positions that correspond to the saw lanes 123, 123' thereby dissecting the stacked assembly into individual stacked units 140. Of course, if the stacked assembly 132 was created with subassemblies that only included single microelectronic elements a dissection step is not required. A mass of solder 142 or other conductive material may be disposed on exposed contacts 122 or 122' so as to enable the individual stacked units 140 to be attached to a substrate such as a circuit panel.

The stacked assembly 132 may also be attached to a circuit panel without having to dice the assembly into individual units if desired.

Figure 9:
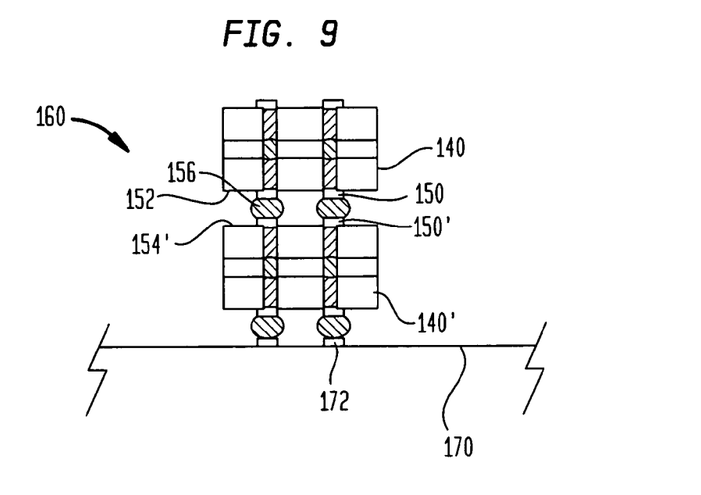
FIG. 9 is a cross-sectional view of individual units of FIG. 8 stacked upon each other.

According to one aspect of the present invention, individual stacked units 140 and 140' may be stacked one upon another with the contacts of individual stacked unit 140 being electrically connected to contacts of individual stacked unit 140'. For example, to electrically connect the individual stacked units 140, 140', the contacts 150 exposed at a lower surface 152 of stacked unit 140 are aligned with the contacts 150' exposed at the top surface 154' of stacked unit 140' The contacts 150 and 150' may then be electrically connected using a mass of conductive material 156 such as solder or attached to one another using other methods known to those in the art. The entire assembly 160 may be attached to a substrate such as circuit panel 170 illustrated in FIG. 9, which includes conductive pads 172.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly comprising:
a first microelectronic element having a front surface, first contacts exposed at the front surface, a rear surface opposite the front surface, and a first edge surface extending between the front and rear surfaces;
a second microelectronic element having a front surface, second contacts exposed at such front surface, a rear surface opposite such front surface, and a second edge surface extending between the front and rear surfaces, the first and second microelectronic elements attached to one another with the rear surfaces of the first and second microelectronic elements facing one another;
a layer extending between the rear surfaces of the first and second microelectronic elements;
at least one bridging element extending between at least one of the first contacts and at least one of the second contacts so as to electrically connect the two, wherein the at least one first contact and the at least one second contact remain exposed for electrically connecting the microelectronic assembly to a substrate external to the microelectronic assembly,
the at least one bridging element extending as a continuous trace along the first and second edge surfaces and along a surface of the layer between the rear surfaces of the first and second microelectronic elements, wherein the layer provides electrical isolation between the at least one bridging element and the bodies of the microelectronic elements.

2. The microelectronic assembly of claim 1, further comprising a plurality of traces exposed on the respective front surfaces of the first microelectronic element and second microelectronic element, at least some of the plurality of traces extending from at least some of the first contacts to the at least one bridging element and at least some of the plurality of traces extending from at least some of the second contacts to the at least one bridging element.

3. The microelectronic assembly of claim 2, wherein the layer includes an adhesive bonding the rear surfaces of the first and second microelectronic elements to one another.

4. The microelectronic assembly of claim 1, further comprising a third microelectronic element having a front face and a rear face, and
a fourth microelectronic element having a rear face,
wherein the third and fourth microelectronic elements are attached such that the rear face of the third microelectronic element faces toward the rear face of the fourth microelectronic element,
the third microelectronic element also being attached to the first and second microelectronic elements such that the front face of the third microelectronic element faces toward the front surface of the second microelectronic element.

5. The microelectronic assembly of claim 1, further comprising masses of conductive material disposed on the plurality of contacts, the conductive material masses enabling electrical connection to the substrate.

6. The microelectronic assembly of claim 1, wherein the bridging elements further include traces extending from the plurality of contacts along the front surfaces of the first and second microelectronic elements.

7. The microelectronic assembly of claim 1, wherein the surface of the layer is arranged in at least substantial alignment with the first and second edge surfaces.

8. A microelectronic assembly comprising:
a first microelectronic element having a front surface, first contacts exposed at the front surface, a rear surface opposite the front surface, and a first edge surface extending between the front and rear surfaces;
a second microelectronic element having a front surface, second contacts exposed at such front surface, a rear surface opposite such front surface, and a second edge surface extending between the front and rear surfaces, the first and second microelectronic elements attached to one another with the rear surfaces of the first and second microelectronic elements facing one another;
an adhesive layer bonding the rear surfaces of the first and second microelectronic elements and having an edge surface arranged in at least substantial alignment with the edge surfaces of the first and second microelectronic elements;
at least one bridging element extending between at least one of the first contacts and at least one of the second contacts so as to electrically connect the two, wherein the at least one first contact and the at least one second contact remain exposed for electrically connecting the microelectronic assembly to a substrate external to the microelectronic assembly, the at least one bridging element extending as a continuous trace along the first and second edge surfaces and along a surface of the adhesive layer between the rear surfaces of the first and second microelectronic elements.

* * * * *